United States Patent [19]

Frankeny et al.

[11] Patent Number: 5,065,227
[45] Date of Patent: Nov. 12, 1991

[54] INTEGRATED CIRCUIT PACKAGING USING FLEXIBLE SUBSTRATE

[75] Inventors: Jerome A. Frankeny, Taylor; Richard F. Frankeny; Karl Hermann, both of Austin; Ronald L. Imken, Round Rock, all of Tex.

[73] Assignee: International Business Machines Corporation, Armonk, N.Y.

[21] Appl. No.: 533,262

[22] Filed: Jun. 4, 1990

[51] Int. Cl.⁵ .................. H01L 23/12; H01L 23/14
[52] U.S. Cl. .......................................... 357/74; 357/80
[58] Field of Search ............... 174/255, 256, 52.4; 357/74, 80, 81, 68

[56] References Cited

U.S. PATENT DOCUMENTS

| | | | |
|---|---|---|---|
| 4,234,666 | 11/1980 | Gursky | 428/573 |
| 4,383,363 | 5/1983 | Hayakawa et al. | 174/256 |
| 4,417,392 | 1/1983 | Ibrahim et al. | 357/80 |
| 4,480,288 | 10/1984 | Gazdik et al. | 361/398 |
| 4,517,051 | 5/1985 | Gazdik et al. | 156/644 |
| 4,551,747 | 11/1985 | Gilbert et al. | 357/81 |
| 4,649,415 | 3/1987 | Hebert | 357/74 |
| 4,681,654 | 7/1987 | Clementi et al. | 156/630 |
| 4,701,781 | 10/1987 | Sankhagowit | 357/70 |
| 4,721,992 | 1/1988 | Emamjomeh | 357/70 |
| 4,723,197 | 2/1988 | Takiar et al. | 361/403 |
| 4,739,448 | 4/1988 | Rowe et al. | 361/386 |
| 4,801,561 | 1/1989 | Sankhagowit | 437/207 |
| 4,873,615 | 10/1989 | Grabbe | 357/80 |
| 4,875,087 | 10/1989 | Miyauchi et al. | 357/80 |
| 4,921,054 | 5/1990 | Voss et al. | 174/256 |
| 4,943,845 | 7/1990 | Wilby | 357/80 |

OTHER PUBLICATIONS

"Enhanced Transverse Via/Transtrip", IBM Technical Disclosure Bulletin, vol. 29, No. 12, May 1987, pp. 5215-5216.
"Improving Polyimide-To-Polyimide Laminate Adhesion on Substrates", Research Disclosure, May 1988, No. 289.
McBride, "Multilayer Flexible Film Module", IBM Technical Disclosure Bulletin, vol. 26, No. 12, May, 1984, p. 6637.

*Primary Examiner*—Rolf Hille
*Assistant Examiner*—S. V. Clark
*Attorney, Agent, or Firm*—Wayne P. Bailey

[57] ABSTRACT

A multilayer, flexible substrate upon which integrated circuit chips can be attached is disclosed. The input-/output(I/O) connections from the chip do not radiate outward from the side of the die, but rather extend from a bottom surface. Since the I/O signal lines would not be accessible for testing once the IC chip is mounted on a substrate, each I/O line is extended outward from the IC footprint to an area on the substrate which is accessible. Additionally, an electrical path from each I/O signal port is simultaneously passed through the substrate layers upon which the chip is mounted, thus providing electrical contact of all I/O ports to the underside of the flexible substrate.

An integrated circuit chip is mounted on this flexible substrate. Since each I/O line is accessible after mounting, the IC chip can be tested prior to mounting on its ultimate carrier. Once tested, the IC chip and the substrate upon which it is mounted are excised from the roll of substrate material. This excised, pretested memory package, which includes both the IC chip and the flexible substrate, can then be mounted directly onto the ultimate carrier either by reflow soldering or direct bonding.

13 Claims, 5 Drawing Sheets

INTEGRATED CIRCUIT PACKAGING USING FLEXIBLE SUBSTRATE

DESCRIPTION

1. Technical Field

The present invention relates to an integrated circuit package. More specifically, the invention pertains to mounting of integrated circuit chips onto a flexible substrate and subsequent mounting of this flexible substrate onto a carrier.

2. BACKGROUND OF THE INVENTION

One of the problems with packaging of integrated circuit devices is being able to test the device at various packaging levels. In a first-level package, the integrated circuit(IC) chip is mounted to a substrate having wiring patterns for electrical contact to a module. This module has electrically conductive pathways or pins, which electrically connect the substrate wiring patterns to a second-level package or carrier. This second-level carrier can have numerous modules attached to it. Because of chip failures or inoperativeness caused by non-perfect manufacturing, a 100% yield in these IC chips is generally unattainable. It is well known to test, grade and mark these IC devices after mounting or connecting them in a module. Attaching defective chips in a module is both a waste of time and materials. Similarly, attaching potentially defective modules to a second-level carrier greatly increases the chances that the carrier will be deemed defective. This carrier can have numerous modules attached to it, and if all these modules were mounted on it prior to initial IC device or module testing, a large number of rejects would potentially occur at this packaging level.

Even when an IC device is tested prior to module attachment, various defects or improper connections can occur when joining the IC to the module. Historically, testing after module attachment has had inherent handling problems in an automated environment, with no easy way to maintain the module packages in proper orientation, and problems with exposed pins being susceptible to damage by the automated equipment.

PRIOR ART

The soldering of integrated circuits with underlying I/O terminals onto a thin polyimide flexible decal with fanout of conductor patterns is shown by McBride, "Multifunction Plug for IC Package", IBM Technical Disclosure Bulletin, Vol. 21, February 1979, pp. 3594-3595. This decal is subsequently mounted to a carrier substrate. However, no automated testing of intermediate levels of packaging would be possible because the flexible nature of decal and not having a supportive structure to support test probes prior to final assembly.

Pretesting IC modules prior to packaging is known in the prior art, with mounting of an IC die onto a single-layer metal foil tape. A temporary, molded-in-place insulative carrier is used to assist in pretesting the IC die by providing support for a fixed spacing of foil leads which are contacted by a test probe. After pretesting, this insulative carrier, along with the perforated edge portions of the tape, are trimmed off leaving a tested molded package which is then bonded to a module or printed circuit board. This approach is only feasible when leads from the IC device extend radially outward from the die to form a gull-wing package mount. Because of the limited periphery surface area of this type of package, inherent limitations exist as to the number of I/O lines which can be supported by this type of package.

Today, more I/O lines are required to support semiconductor devices that have increased in functional capabilities, and the problem of electrical interconnection within a first-level package becomes significant. In an attempt to solve this problem of limited I/O capability, integrated circuit chips using solder in controlled collapse circuit connections(hereinafter C-4) provide increased I/O capabilities for these larger chips. This C-4 technology is more fully described in articles by L. F. Miller, "Controlling Collapse Reflow Chip Joining", IBM Journal of Research and Development Vol. 13 (1969), pages 239-250, L. S. Goldmann, "Geometric Optimization of Controlled Collapse Interconnections", IBM Journal of Research and Development Vol. 13 (1969), pages 251-265, and K. C. Norris and A. H. Landzberg, "Reliability of Controlled Collapse Interconnections", IBM Journal of Research and Development Vol. 13 (1969) pages 266-271, the aforementioned articles hereby incorporated by reference.

This C-4 technology has similarly been used in environments which do not require high I/O densities. The desire to provide a uniform packaging technology for integrated circuits having either low I/O requirements, such as memory devices, or high I/O requirements, such as logic devices, has resulted in using C-4 technology to package memory chips which do not have high density I/O requirements.

However, there has not been developed a flexible procedure for testing, grading, and handling C-4 devices in a highly automated environment. Thus, in solving the I/O pin count problem, by increasing the number of signal lines which could be supported by previous IC packages, the C-4 integrated circuits have introduced a problem of not being able to be pretested, in an automated manufacturing environment, prior to being packaged in a next-level carrier.

It is also known that integrated circuit chips can be mounted on flexible films so that thermal mismatch between the chip and the carrier will not cause undue stress, as discussed by Joshi et al in "Circuit Module Packaging", IBM Technical Disclosure Bulletin, Vol. 25, July 1982, p. 558 and McBride, D. G. in "Multilayer Flexible Film Module", IBM Technical Disclosure Bulletin, Vol 26, May 1984, p 6637. This procedure allows for mounting a multilayer flexible structure to a conventional metallized substrate, with I/O pins passing though all the layers of the flexible film to the outside of the module. Further, McBride teaches that individual layers of flexible films can be tested prior to their interconnections in the stacked module. This procedure requires a ceramic substrate for proper heat dissipation, however, and only allows testing of individual layers prior to construction. Conventional I/O pins extend through the multilayer, flexible material for attachment to a next, level carrier with the same type of problems previously discussed regarding pin failures.

Another problem introduced by the use of multilayer flexible material as a substrate is proper alignment of the vias in each individual substrate layer. As the I/O density is increased on C-4 integrated circuit chips, particularly when used with logic devices as opposed to memory devices, a corresponding density increase must also occur at the point where the chip pads contact the multilayer flexible material. These contact points can extend through adjoining layers of the multilayer material, thus requiring critical alignment procedures between adjoining layers due to the high degree of tolerance required to achieve proper alignment.

It is therefore an object of the present invention to improve integrated circuit device packaging.

It is a further object of the present invention to allow ease of testing an integrated circuit package.

It is a further object of the present invention to more easily test C-4 integrated circuit devices.

It is a further object of the present invention to improve integrated circuit device packaging for ease of handling in an automated manufacturing environment.

It is still a further object of the present invention to accommodate high density vias in a flexible substrate.

These and other objects and features of the invention will appear from the following detailed description in which the preferred embodiment is set forth with reference to the accompanying drawings.

SUMMARY OF THE INVENTION

The present invention eliminates the above mentioned problems by packaging IC devices on a flexible substrate package prior to test. This flexible substrate package is configured to allow for ease of handling and testing, particularly for memory chips with a C-4 attachment architecture. Peripheral wiring allows for ease of testing from the top side of the package. Good chips can be excised and mounted to a second level carrier with little increase in the chip footprint area because the final connection is made with the through vias on a flexible carrier.

This invention uses a multilayer, flexible substrate upon which integrated circuit chips can be attached. The input/output(I/O) connections from these chips do not radiate outward from the side of the die, but rather extend from a bottom surface. The use of the bottom surface is desired to minimize the chip footprint area which will be consumed when mounted to the next level package. An electrical path from each I/O signal port is passed through the substrate layers upon which the chip is mounted, thus providing electrical contact of all I/O ports to the underside(side opposite the IC chip mount) of the flexible substrate. However, since the I/O signal lines would not be accessible for testing once the IC chip is mounted on a substrate, each I/O line is simultaneously extended outward from the IC footprint to an area on the substrate which is accessible.

Since the integrated circuit chip is mounted on a sheet, reel, or roll of flexible substrate, and in one embodiment having sprocket holes along the edges of the substrate, this mounting can be done in a highly automated fashion. Additionally, since each I/O line is accessible after mounting, the IC chip can be tested prior to mounting on its ultimate carrier. The most common use anticipated for this pretest procedure is for C-4 packaged memory integrated circuits, although the process is applicable to any integrated circuit device and would include Once tested, the IC chip and the substrate upon which it is mounted are excised from the roll of substrate material. In this excise process, an area slightly larger than the footprint of the chip is cut from the flexible substrate. This excised pretested package, which includes both the IC chip and the flexible substrate, can then be mounted directly onto the ultimate carrier either by reflow soldering or direct bonding. This reflow soldering procedure is described more thoroughly in a pending application Ser. No. 07/347,842, filed May 5, 1989, assigned to the same assignee as the present invention and hereby incorporated by reference, which discloses a method for effecting the desired electrical interconnection between preselected locations without the necessity for precisely aligning the conductive areas to be electrically connected.

Additionally, a process for manufacturing the flexible substrate is described which provides a method for producing electrically isolated vias and through-hole circuitization in a thin, flexible, organic/metal substrate. The only precision required is in the initial via formation process (punching, drilling, ablation, etc.). The electrical isolation of these holes by the coating and evacuation process is not sensitive to hole location. No subsequent punching, drilling, or ablation techniques are required to open holes filled with a dielectric material, thus allowing for dense hole locations. The process is likewise compatible with roll processing of material which provides for lower cost manufacturing than batch processes.

DETAILED DESCRIPTION OF THE PREFERRED EMBODIMENT OF THE INVENTION

The process for producing a multilayer substrate will first be described. This process is particularly desired when supporting high density I/O devices to be mounted thereupon, but is similarly useful and part of the preferred embodiment for supporting the low density I/O memory chip packaging method herein disclosed.

Figure 1:
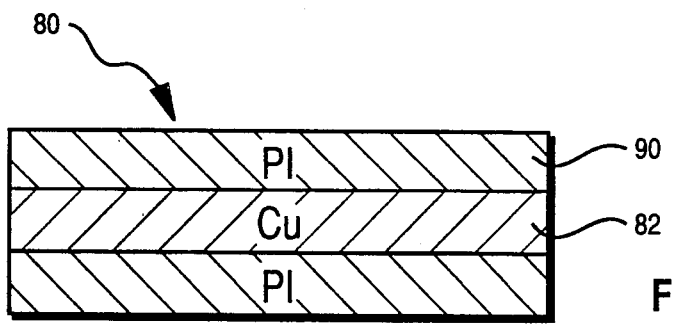
FIG. 1 is a sectional view of a organic/metal/organic substrate.
Figure 2:
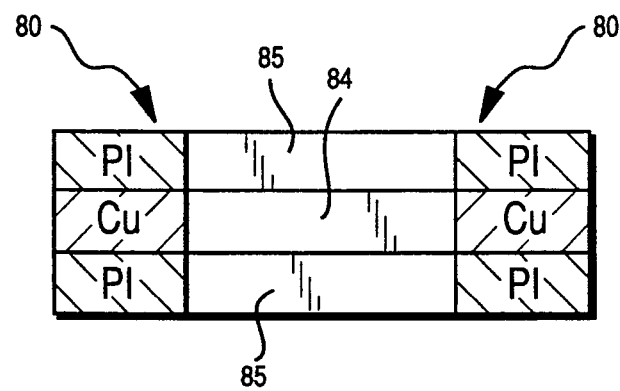
FIG. 2 is a sectional view of a organic/metal/organic substrate after via hole creation.
Figure 3:
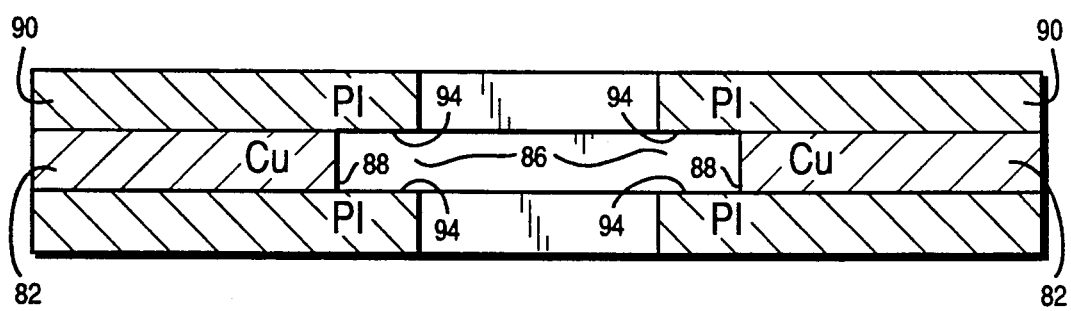
FIG. 3 is a sectional view of a organic/metal/organic substrate after etching.

As shown in FIG. 1, an organic/metal/organic laminate 80 has a metal core 82 coated on each side with an organic material 90 such as polyimide or epoxy. The metal core 81 is comprised of any number of metals or metal laminates. The metal core 82 should thermally match the integrated circuit to be attached thereto as closely as possible. In the preferred embodiment, this thermal match is achieved with the metal core 82 consisting essentially of copper/invar/copper. FIG. 2 shows the result after holes are punched or laser drilled in this laminate 80, the holes serving as vias 84 for electronic interconnects between sides of the substrate. In order to create a reservoir for subsequent filling with a liquid polyimide, the laminate 80 shown in FIG. 2 is etched with a chemical solution to remove a small amount of the metal core material 82 in each via 84 to create a reservoir 86, as shown in FIG. 3. Any number of chemical etches may be used depending on the core metal to be removed. For copper core laminates, solutions of hydrochloric acid or cupric chloride or ferric chloride are effective, as well as certain persulphate or peroxide/sulphuric acid solutions. Etching rate can be regulated through adjustment of solution concentrations, temperature, and agitation.

At this point, the exposed metal 88 in the laminate core may be electroplated to provide a diffusion barrier between the core metal and the organic which will be used to fill the reservoir. In order to enhance adhesion between the cured organic material 90 of the original laminate 80 and the uncured polyimide 92 to be applied to the reservoir area, the surface of the cured laminate is treated with a basic solution such as described in IBM Research Directory, May 1989, No. 289, Item 28957, hereby incorporated by reference. This solution hydrolyzes the surface 94 of the exposed organic material 90 creating carboxylic acid groups which can react with the polyamic acid in the subsequently applied polyimide solution.

After rinsing with deionized water and drying at low temperature to avoid reimidization of the hydrolyzed polyimide, the laminate is coated with an uncured polyimide solution (such as DuPont PI 2545) so that the via holes are permeated or filled with the solution. A squeegee or doctor blade is effective for this purpose in that it forces the polyimide into the via holes without leaving a heavy buildup of polyimide on the top and bottom laminate surfaces. A series of squeegees or doctor blades may be required to assure good coating of the hole and removal of excess polyimide from the outer surfaces of the substrate. In the preferred embodiment, the substrate is then passed over a vacuum or compressed gas zone to evacuate the polyimide material from each via hole. This vacuum or gas pressure should be regulated to avoid removal of excessive amounts of polyimide but still assure open vias.

Since the polyimide solution usually contains solvent, the substrate must be dried according the the manufacturer's recommendations (for the polyimide material). Additional coating and drying operations may be used to build greater polyimide thickness 92 in the vias 84.

Once the desired, dried polyimide thickness 92 in the substrate reservoir 86 has been achieved, the polyamic acid of the polyimide is converted to fully imidized polyimide through a high temperature staged bake. This staged bake proceeds through four different temperature cycles in the preferred embodiment. The first bake is done at 85 degrees C. for 30 minutes. The second stage bake is done at 150 degrees C. for another 30 minutes. The third stage bake is done at 30-45 minutes at 230 degrees C., in a nitrogen atmosphere. Finally, the fourth stage bake occurs at 400 degrees C. for 30-60 minutes, in a nitrogen or forming gas atmosphere.

Figure 4:
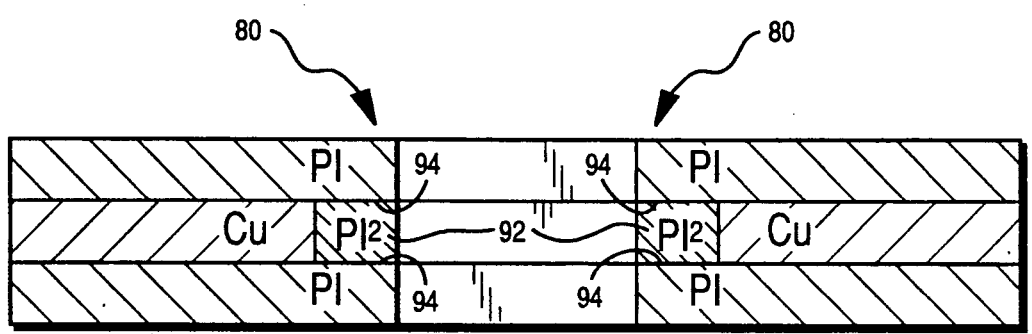
FIG. 4 is a sectional view of a organic/metal/organic substrate after baking.

The aforementioned process would achieve a result as shown in FIG. 4 and result in good adhesion between the polyimide 92 and laminate 80.

If electrical contact to the metal core is desired in another via or at another location, a second punching or laser drilling operation is used to expose the metal, once the above mentioned high temperature bake has been completed. In an alternate embodiment, an ablation process (mechanical, chemical, or laser) could remove only polyimide on one side of the substrate to expose the metal core groundplane 96.

Figure 5:
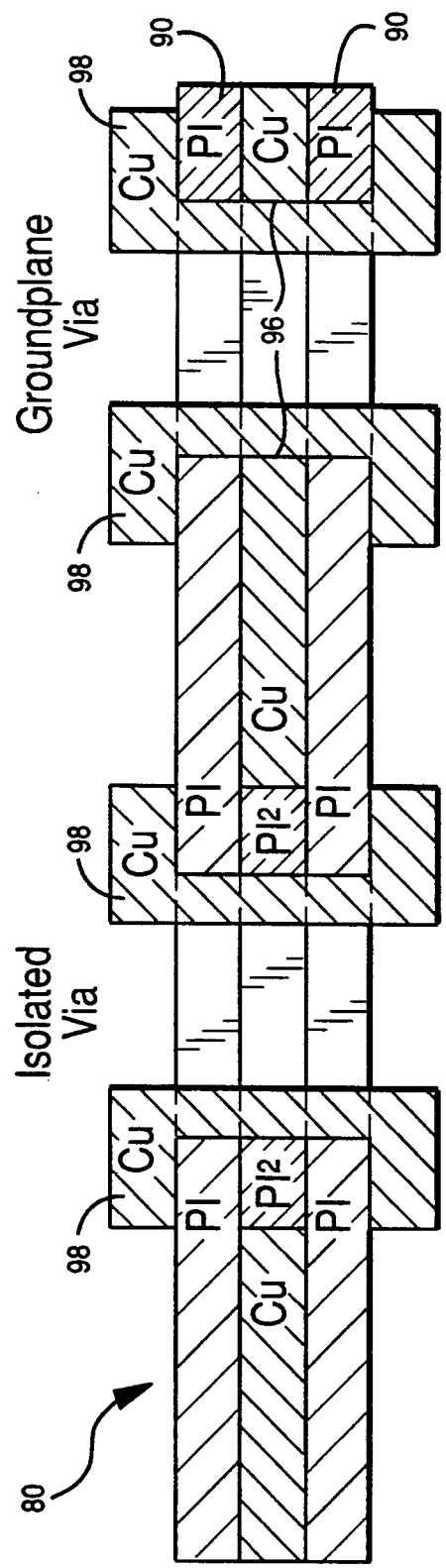
FIG. 5 is a sectional view of a organic/metal/organic substrate after metal applied to via holes.

Circuitization of the substrate is accomplished by traditional plating, photoimaging and etching techniques common to printed wiring board manufacture. The finished circuit card would have a construction as shown in FIG. 5 with metal 98 applied through both electrically isolated and groundplane vias.

Figure 6:
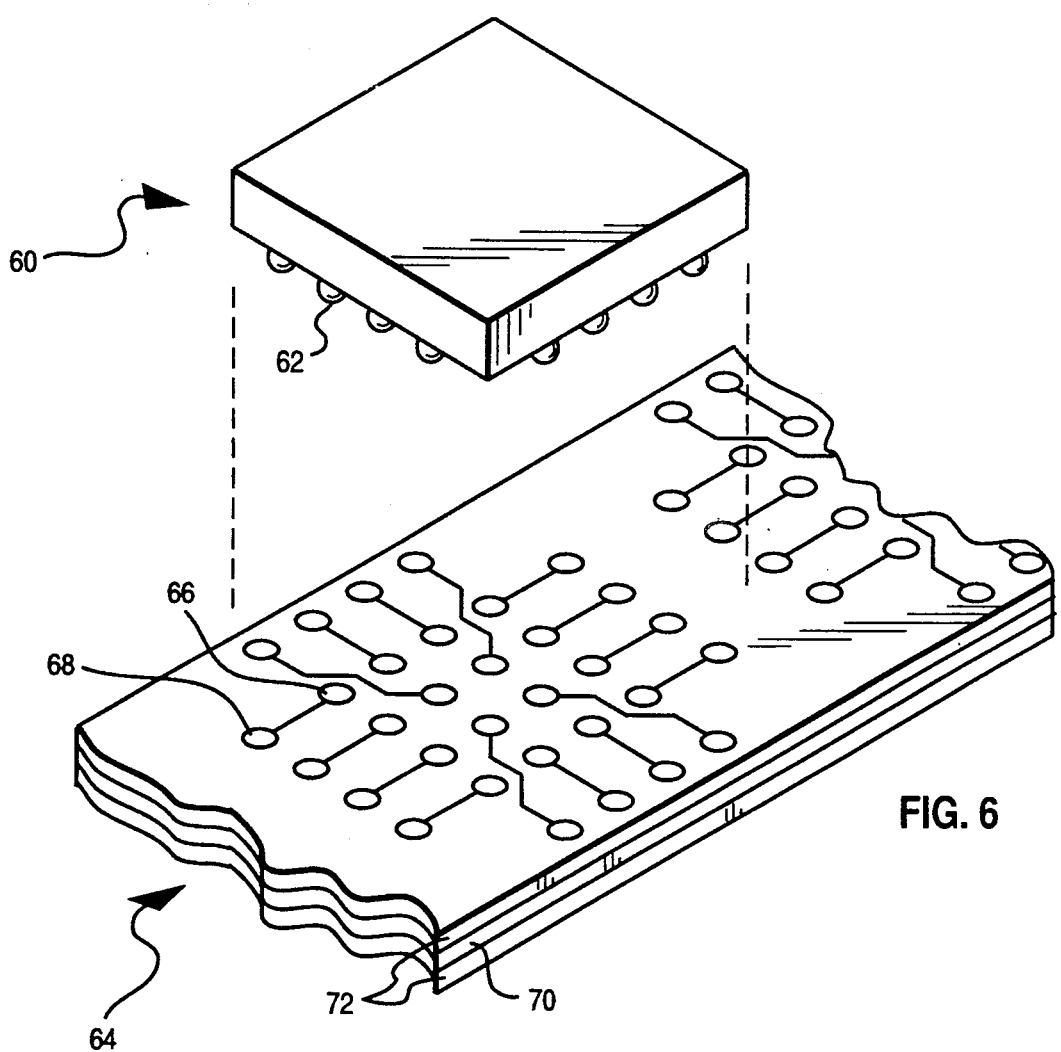
FIG. 6 is a perspective view showing an integrated circuit die prior to being mounted on a flexible substrate.

FIG. 6 shows a flexible substrate 64 composed of two signal layers 72 and one power plane 70. As is known, the flexible substrate may contain sprocket holes(not shown) at its edges for moving and indexing the substrate into assembly process position. This substrate has plated through vias 66 as well as contact pads 68. When using the aforementioned substrate manufacturing process, the resulting substrate 64 is typically about 0.005 to 0.007 inches thick. The described packaging is not limited to the substrate manufacturing process herein disclosed, however, and is applicable to any flexible substrate. The plated thru vias 66 are located on the substrate in the same pattern as the C-4 solder balls, and in the preferred embodiment these C-4 solder balls are on 0.010 inch centers. The vias 66 are filled either with solder, or with a conductive paste such as a conductive polymer or metal filled polymer.

Chip 60 is placed on substrate 64 and C-4 solder balls 62 are soldered to the filled vias 66. Since all of the I/O's to the chip 60 are connected to a top side contact 68 coupled thereto, each I/O pin the chip can be tested after attachment from the chip side(topside) of the substrate 64.

Figure 7:
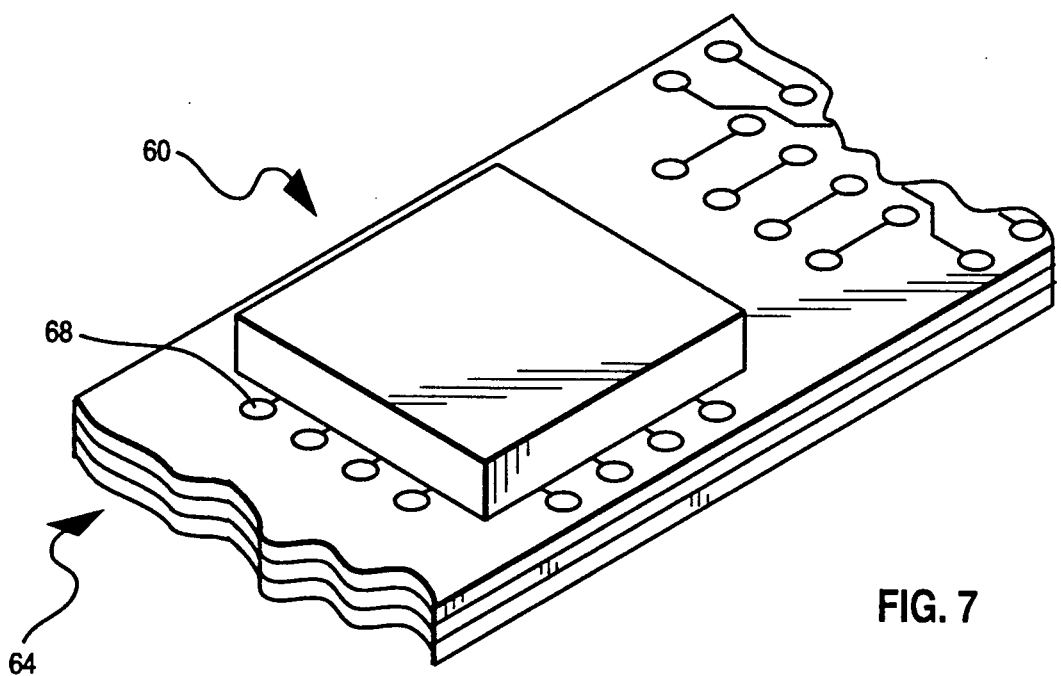
FIG. 7 is a perspective view showing an integrated circuit die mounted on a flexible substrate.
Figure 8:
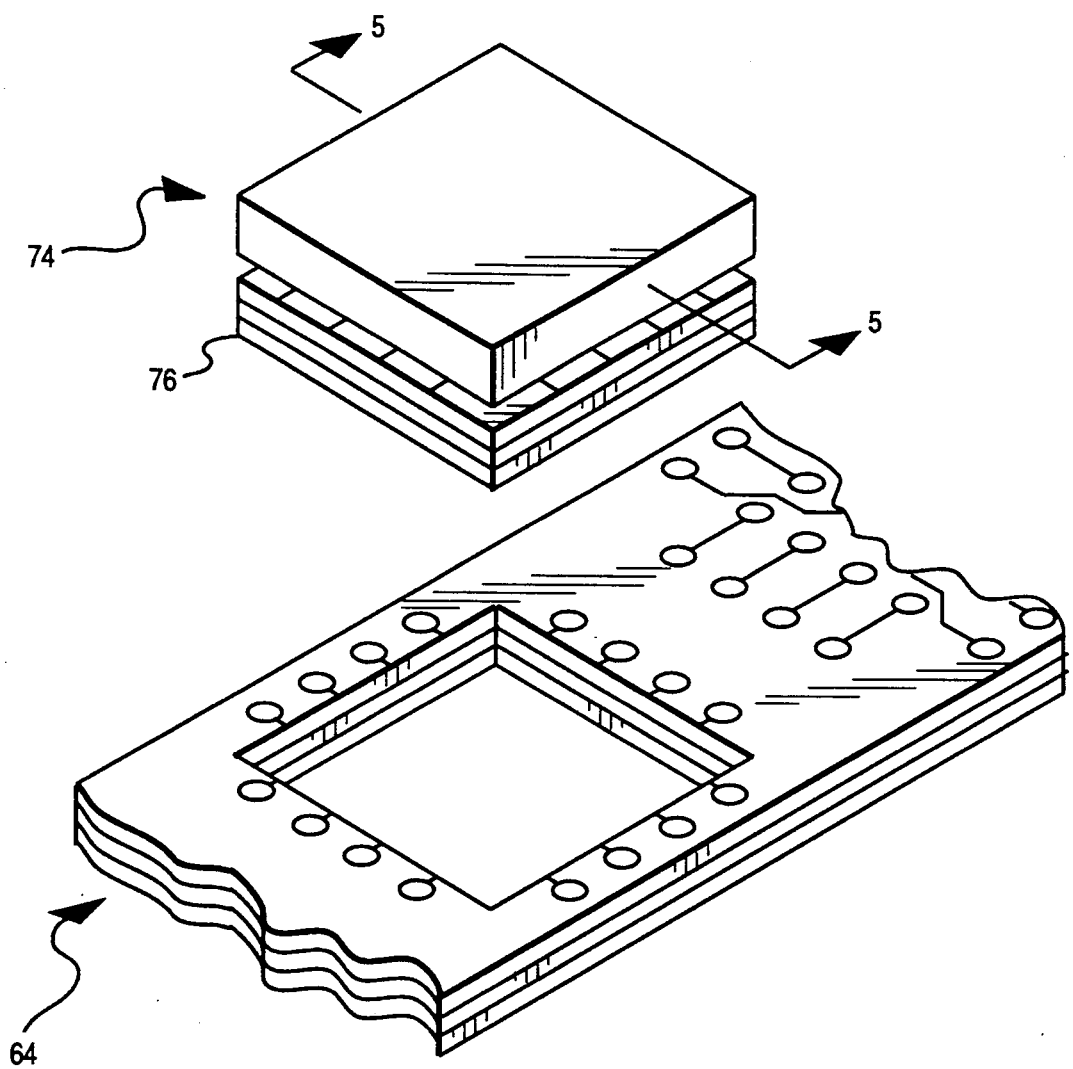
FIG. 8 is a perspective view showing a resulting package excised from a flexible substrate.

FIG. 7 shows chip 60 attached to carrier 64 with I/O contact pads 68 exposed for testing. This works particularly well for memory chips because of their low number of I/O lines and their requirement for testing and burn-in before assembly into larger functional packages. After testing the strip substrate 64 has the good chips excised. Good chips can be 100, 75, or 50 percent good. Since the conductively filled vias 66 go all the way through the substrate 64, all of the chip I/O are available on the bottom for z-axis attachment to a carrier 78 which is used to assemble multiple good chips to produce a functional memory.

Figure 9:
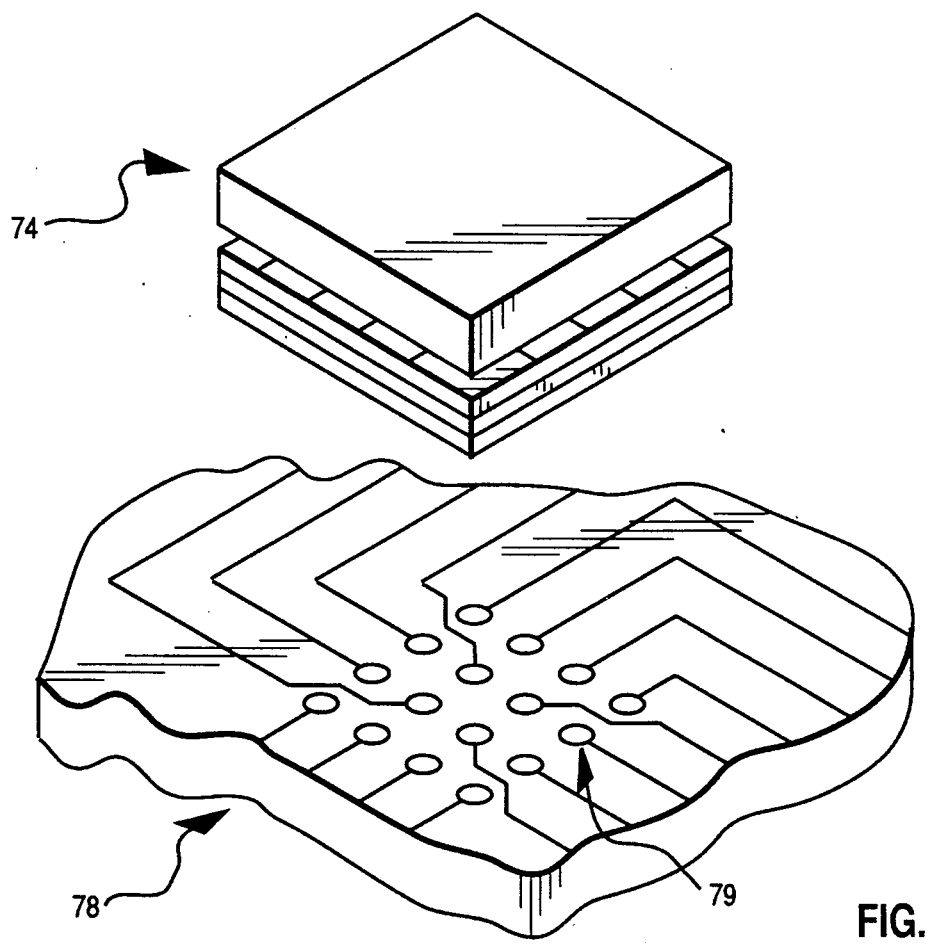
FIG. 9 is a perspective view showing a package prior to being mounted on a carrier.
Figure 10:
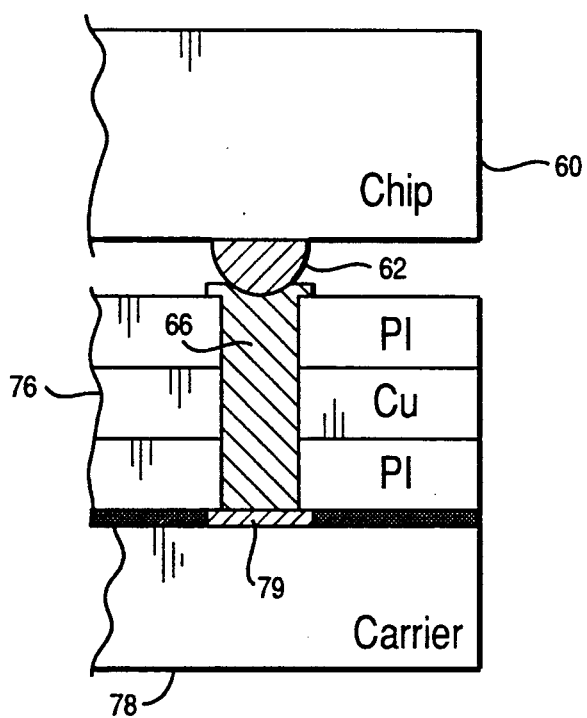
FIG. 10 is a cross-sectional view of a package after being mounted on a carrier.

Carrier 78 can be any substrate that will allow direct chip attach. FIG. 9 shows a carrier 78 with solder pads 79. These solder pads 79 have solder applied, in the preferred case, with a lower melting point solder than the one used to attach the chip to substrate 76. Now the chip package 74 is located so the pads on substrate 76 align with those on carrier 78. The combination of chip package 74 and carrier 78 is reflowed to make final attachment of the chip package 74 to the carrier 78. The resulting conductive path shown in FIG. 10 extends from the C-4 solder balls 62 through a via 66 to a solder pad 29.

A reflow procedure or direct bonding for final attachment of the chip package 74 to a carrier 78 in FIG. 9 is used to complete assembly. In one embodiment, this reflow procedure uses a solder strip as described in previously cited copending application 07/347,842. In an alternate embodiment, pads 79 have a conductive adhesive applied and attachment to chip/carrier 74 could be made with such conductive adhesive.

While we have illustrated and described the preferred embodiments of our invention, it is to be understood that we do not limit ourselves to the precise constructions herein disclosed and the right is reserved to all changes and modifications coming within the scope of the invention as defined in the appended claims.

We claim:

1. An integrated circuit package comprising:
   a flexible multilayer substrate strip having semiconductor chip input and output patterns; and
   at least one integrated circuit chip attached to said flexible multilayer substrate, said integrated circuit chip having an outer footprint,
   said input and output patterns extending past said outer footprint for testing and extending through said flexible multilayer substrate, within said outer footprint, for z-axis attachment.

2. A integrated circuit package according to claim 1 wherein said semiconductor chips are C-4 chips.

3. A integrated circuit package according to claim 1 wherein said semiconductor chips are array I/O flip chips.

4. An integrated circuit package according to claim 1 wherein said flexible multilayer substrate comprises a metal inner core sandwiched between two organic couter surfaces.

5. An integrated circuit package according to claim 4 wherein said metal inner core comprises copper/invar/copper.

6. An integrated circuit package according to claim 4 wherein said organic outer surface comprises any of polyimide and polymer materials.

7. A flexible multilayer substrate strip according to claim 1 wherein said strip has sprocket holes extending along a longitudinal axis of said strip.

8. An integrated circuit assembly comprising:
   an integrated circuit package, said integrated circuit package further comprising:
   a multilayer substrate having chip input and output patterns, said multilayer substrate having an outer periphery, and
   at least one semiconductor chip attached to said multilayer substrate, said semiconductor chip having a footprint smaller than said outer periphery of said multilayer substrate,
   said chip input and output patterns extending past said footprint and extending through said flexible multilayer substrate, within said footprint, for z-axis attachment;
   a carrier; and
   attachment means for attaching said integrated circuit package to said carrier.

9. An integrated circuit assembly according to claim 8 wherein said multilayer substrate further comprises vias filled with solder.

10. An integrated circuit assembly according to claim 8 wherein said multilayer substrate further comprises vias filled with conductive paste.

11. An integrated circuit assembly according to claim 9 wherein said attachment means comprises low temperature solder with a lower temperature melting point than said solder in said vias.

12. An integrated circuit assembly according to claim 9 or 10 wherein said attachment means comprises solder balls.

13. An integrated circuit assembly according to claim 9 or 10 wherein said attachment means comprises a conductive adhesive.

* * * * *

UNITED STATES PATENT AND TRADEMARK OFFICE
CERTIFICATE OF CORRECTION

PATENT NO. : 5,065,227

DATED : November 12, 1991

INVENTOR(S) : Jerome A. Frankeny, Richard F. Frankeny and Karl Hermann

It is certified that error appears in the above—identified patent and that said Letters Patent is hereby corrected as shown below:

On the title page: Item [75]

Inventors:, please remove "Ronald L. Imken, Round Rock," from the patent; and

Col. 7, line 23, please delete "couter" and insert --outer--.

Signed and Sealed this

Twenty-second Day of June, 1993

Attest:

MICHAEL K. KIRK

Attesting Officer

Acting Commissioner of Patents and Trademarks